United States Patent

Kato

[11] Patent Number: 5,812,396
[45] Date of Patent: Sep. 22, 1998

[54] SYNCHRONOUS POSITIONING CONTROL APPARATUS AND CONTROL METHOD THEREOF

[75] Inventor: Hiroaki Kato, Utsunomiya, Japan

[73] Assignee: Canon Kabushiki Kaisha, Tokyo, Japan

[21] Appl. No.: 608,569

[22] Filed: Feb. 28, 1996

[30] Foreign Application Priority Data

Mar. 2, 1995 [JP] Japan .................................. 7-066687

[51] Int. Cl.$^6$ .................................................. G05B 19/18
[52] U.S. Cl. .............................. 364/167.07; 364/167.02; 364/167.06; 364/167.1
[58] Field of Search .............................. 364/167.01, 162, 364/190, 167.06, 167.07, 167.08, 167.09, 167.1, 140.02, 140.03; 355/18, 53; 354/401

[56] References Cited

U.S. PATENT DOCUMENTS

| | | | |
|---|---|---|---|
| Re. 33,836 | 3/1992 | Resor, III et al. ........................ | 355/43 |
| 4,016,396 | 4/1977 | Hassan et al. ...................... | 219/121.31 |
| 4,223,257 | 9/1980 | Miller ...................................... | 318/594 |
| 4,604,562 | 8/1986 | Phillips .................................... | 318/640 |
| 4,742,376 | 5/1988 | Phillips .................................... | 355/77 |
| 4,761,597 | 8/1988 | Sasaki et al. ............................ | 318/625 |
| 4,912,753 | 3/1990 | Evans, Jr. ................................ | 395/80 |
| 4,948,330 | 8/1990 | Nomura et al. .......................... | 414/749 |
| 5,214,489 | 5/1993 | Mizutani et al. ........................ | 356/363 |
| 5,269,882 | 12/1993 | Jacobsen .................................... | 216/13 |
| 5,272,501 | 12/1993 | Nishi et al. ................................ | 355/53 |
| 5,323,012 | 6/1994 | Auslander et al. .................. | 250/492.2 |
| 5,365,342 | 11/1994 | Ayata et al. .............................. | 356/401 |
| 5,483,311 | 1/1996 | Sakakibara et al. ...................... | 355/53 |
| 5,489,986 | 2/1996 | Magome et al. ......................... | 356/401 |
| 5,506,684 | 4/1996 | Ota et al. ................................. | 356/401 |
| 5,511,930 | 4/1996 | Sato et al. ................................ | 414/676 |
| 5,548,195 | 8/1996 | Doran ................................. | 318/568.19 |
| 5,572,419 | 11/1996 | Nishimura ................................ | 364/131 |
| 5,633,720 | 5/1997 | Takahashi ................................ | 356/401 |

FOREIGN PATENT DOCUMENTS 60-169909  9/1985  Japan .
3-252704  11/1991  Japan .

*Primary Examiner*—Emanuel Todd Voeltz
*Assistant Examiner*—Demetra R. Smith
*Attorney, Agent, or Firm*—Fitzpatrick, Cella, Harper & Scinto

[57] ABSTRACT

A synchronous positioning control apparatus for servo-controlling positions of a plurality of stages in different feedback loops in order to synchronously control each of the stages, includes a synchronization compensator in which a feedback loop of each of the stages is supplied with position information of at least one of the other stages. Even when any of the plurality of stages is affected by a disturbance, synchronization performance of the stages can be improved by the present invention.

10 Claims, 4 Drawing Sheets

SYNCHRONOUS POSITIONING CONTROL APPARATUS AND CONTROL METHOD THEREOF

BACKGROUND OF THE INVENTION

The present invention relates to a synchronous positioning control apparatus and control method thereof which can be applied to various machining systems having a plurality of manipulation axles, such as an exposure apparatus for semiconductor manufacture, comprising a plurality of stages, machine tools, or robots.

As an example of a most simple and easy-to-realize control method of controlling manipulation axles of a control system in a machining system having at least two or more manipulation axles, a position control method which independently controls each manipulation axle can be given. For each manipulation axle, a target position is computed based upon a given predetermined reference and the manipulation axle is controlled in accordance with the computed target position. In a control system with the aforementioned configuration, suppose one of the manipulation axles is offset due to a disturbance. A synchronization error among manipulation axles occurs and control becomes offset from the predetermined reference. Since controlling of each manipulation axle is independent, restoration of synchronization mostly depends upon a self-correction capability of the manipulation axle that has been offset, that is, upon disturbance control performance of the position control system of each manipulation axle. Since response performance of each manipulation axle is limited, it is difficult in the control method of independently controlling manipulation axles to maintain synchronization exceeding certain limitations.

RELATED ART

A conventional synchronous positioning control method for maintaining synchronization is performed by keeping each of the manipulation axles coherent to one another, especially when a subject machine system has two manipulation axles. A master-slave method with one axle as a master axle and the other axle as a slave axle has been utilized. A typical structure of a master-slave synchronization method is illustrated in FIG. 4. In FIG. 4, reference numerals 1a and 1b denote transfer functions $G_1$, $G_2$ of a combined system of a controlling subject and a series compensator arranged before the controlling subject. A reference numeral 10 denotes a synchronization compensator for correcting a position error occurring between two manipulation axles, that is, synchronization error e; and a transfer function thereof is referred to as F. The synchronization error e between two manipulation axles is defined as a value obtained by subtracting the controlled variable of one of the manipulation axles from the controlled variable of the other manipulation axle, as shown in equation (1).

$$e = c_1 - c_2 \quad (1)$$

Both manipulation axles possess a position feedback loop for driving the manipulation axle toward a reference r. In addition, synchronization compensation is performed by sending a compensation value as a feedback, obtained from a synchronization error e by applying the synchronization compensator to the slave axle as a reference, so that a controlled variable $c_2$ on the slave axle is coherent to a controlled variable $c_1$ on the master axle. When synchronization between the two manipulation axles is disturbed due to a position error $e_1 = r - c_1$ on a master axle caused by some disturbance, the master axle moves in a direction to correct the position error $e_1$ by disturbance-control performance possessed by the master axle, and the slave axle also moves in a direction to correct the synchronization error e. When synchronization between two manipulation axles is disturbed due to a disturbance on a master axle, both the master and slave manipulation axles execute a correction of the synchronization error e; therefore, the method of synchronous positioning control is superior in maintaining synchronization to a method of independently controlling each manipulation axle. A P compensator, a PI compensator or a PID compensator is normally utilized as the synchronization compensator F. Note that the reference P denotes a proportional action, PI denotes a proportional+integral action, and PID denotes a proportional+integral+differential action.

Various methods have conventionally been suggested for a master-slave synchronization control which performs synchronization control on two manipulation axles. The general idea is basically the same as the method shown in FIG. 4, although there are some differences in loop structures. For instance, Japanese Patent Laid-Open No. 60-169909 discloses the same loop structure as shown in the block diagram FIG. 4; and herein a synchronization compensator performs a PID action. In Japanese Patent Laid-Open No. 3-252704, a difference of position errors is computed as a synchronization error by subtracting a controlled variable from a reference value of each manipulation axle, instead of computing a difference of controlled variables, and is fed back to a slave axle via a synchronization compensator utilizing proportional action. Since the reference is identical for both manipulation axles, taking a difference of position errors of each manipulation axle is equivalent to taking a difference of controlled variables. Therefore, this prior art can be considered to be the same as a method described in FIG. 4.

The block diagram describing a master-slave synchronization control method shown in FIG. 4 is equivalently transformed into the block diagram of a loop structure as shown in FIG. 5. As can be seen from FIG. 5, even when a synchronization compensation loop is established, the characteristics of a master axle is identical to the case in which each manipulation axle is independently controlled. On the slave axle on the other hand, a transfer function of a combined system of the series compensator and the control subject is converted to $(1+F) G_2$ from an original $G_2$. Further, a reference $r_2$ inputted to a position control closed loop on the slave axle is obtained by equivalent transformation of $r_2$, that is, by multiplying an original reference r and the present position $c_1$ of the master axle by weight functions 1 and F respectively, which gives a normalization by 1+F. If a gain of transfer function F of the synchronization compensator 10 is sufficiently larger than 1 in a practical frequency band, the slave manipulation reference $r_2$ is substantially coherent to a controlled variable $c_1$ of the master axle. In a master-slave synchronization control method where a synchronization error is fed back to the other manipulation axle, a position of a slave axle is manipulated according to a change of a controlled variable of the master axle caused by a disturbance.

The conventional master-slave synchronous controlling methods as described above have a substantial synchronization compensation effect on disturbance added to a master axle, compared to that of a control method of independently controlling each manipulation axle. However, the problem to be solved by this method is that synchronization compensation means for correcting disturbance on a slave axle solely depends upon a self-disturbance-control of a slave axle. In the master-slave method, there is no feedback loop from a slave axle to a master axle. As a result, the slave axle itself is solely responsible for coping with disturbance on the slave manipulation axle. Consequently, the master-slave synchronous controlling method merely has the same synchronization compensation capability as the method of individually controlling each manipulation axle.

SUMMARY OF THE INVENTION

The present invention has been made in consideration of the above situation, and the object of the present invention is to develop a synchronous positioning control method and an apparatus thereof capable of bilateral synchronization control of stages, in which an equivalent synchronization effect can be obtained for disturbance added to any of the stages; wherein drawbacks of the master-slave relations exemplified in the conventional synchronization control method have been removed, and wherein a plurality of stages are equivalent to one another.

According to the present invention, the foregoing object is attained by providing a synchronous positioning control apparatus and a control method thereof which controls synchronous positioning of each of a plurality of stages; wherein positions of the plurality of stages are servo-controlled in different feedback loops, in which the feedback loop of each stage is supplied with position information of at least one of the other stages.

The present invention is suitable for synchronously controlling a wafer stage and a reticle stage of a scan-type exposure apparatus for semiconductor manufacture, for instance. In this case, a position control system comprising a series compensator and a feedback compensator is established at two stages which are the subject of synchronization controlling. The series compensator corrects the reference before it is inputted to a position control system. A synchronous positioning control apparatus is structured, which is capable of bilateral synchronization control having an equivalent synchronization position control effect on disturbance added to any of the stages, by having crossed loops between both stages, where a controlled variable of one stage is inputted through a compensator to another stage as a reference.

There are various loop structures where both stages are coherent to each other. In the present invention, attention has been given to the conventional master-slave synchronization control method where a target position in the slave axle must be manipulated in accordance with a change in a controlled variable of a master axle. From this drawback, the hierarchy between master and slave axles has been removed and a loop structure has been established as such that a position change in one of the stages is reflected upon the target position of the other stage.

In the above-described structure, suppose there was a position error due to a disturbance in one of the stages. The current position of the stage is inputted as a reference to the other stage via a synchronization compensator; therefore, the position error is reflected upon a change on a target value of the other stage. In other words, when one of the stages is slower than the other stage, the target value of the other stage is decreased accordingly; vice versa, when one of the stages is faster than the other stage, the target value of the other stage is increased accordingly. Between these stages, there is no distinction as a master or a slave and a position error of any one of the stages will be responded to by the other stage which moves in a direction to maintain synchronization.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention wherein a synchronous positioning control is applied to a stage control of an exposure apparatus for semiconductor manufacture will be described in detail in accordance with the accompanying drawings.

<First Embodiment>

Figure 3:
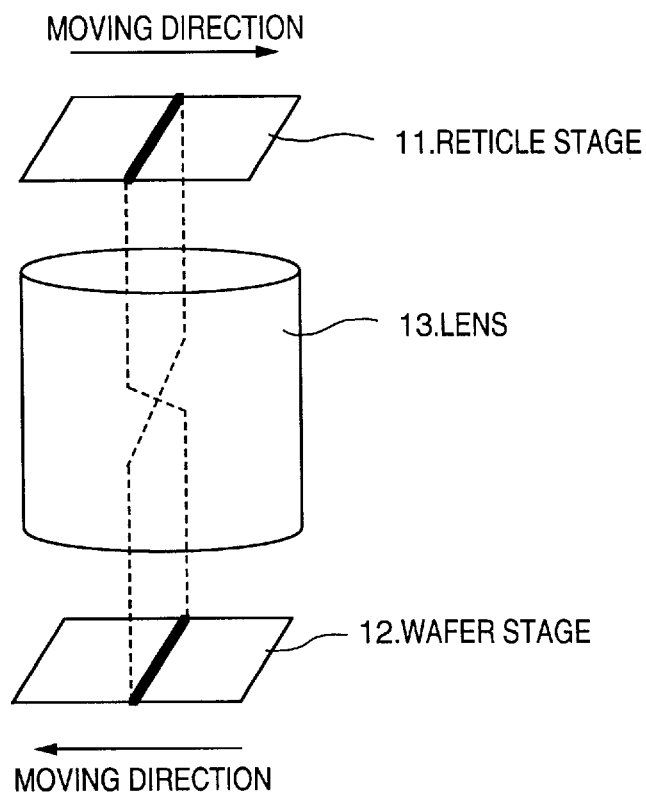
FIG. 3 is a conceptional view of a scan-type exposure apparatus having a wafer stage and a reticle stage.

In an exposure apparatus for semiconductor manufacture, a scan exposure method is utilized which is advantageous in expanding an exposure area of a wafer. FIG. 3 is a conceptional view of a scan-type exposure apparatus having a wafer stage and a reticle stage. In FIG. 3, a reticle forming a circuit pattern of a semiconductor (not shown) is placed on a reticle stage 11 and a semiconductor wafer (not shown) is placed on a wafer stage 12. In a scan exposure method, movement of the reticle stage 11 and the wafer stage 12 are synchronized and each moves in an opposite direction as indicated with arrows in FIG. 3. In this method, the wafer (not shown) placed on the wafer stage 12 is exposed by scanning and the pattern placed on the reticle stage 11 is printed. In this exposure method, when a synchronization error occurs between the stages, the wafer is out of position; therefore, it is important to maintain synchronization. Applying the present invention to such a scan-type exposure apparatus makes it possible to control a displacement of the original pattern by maintaining synchronization between both stages even when a positional error occurs in any of the stages due to disturbance.

Figure 1:
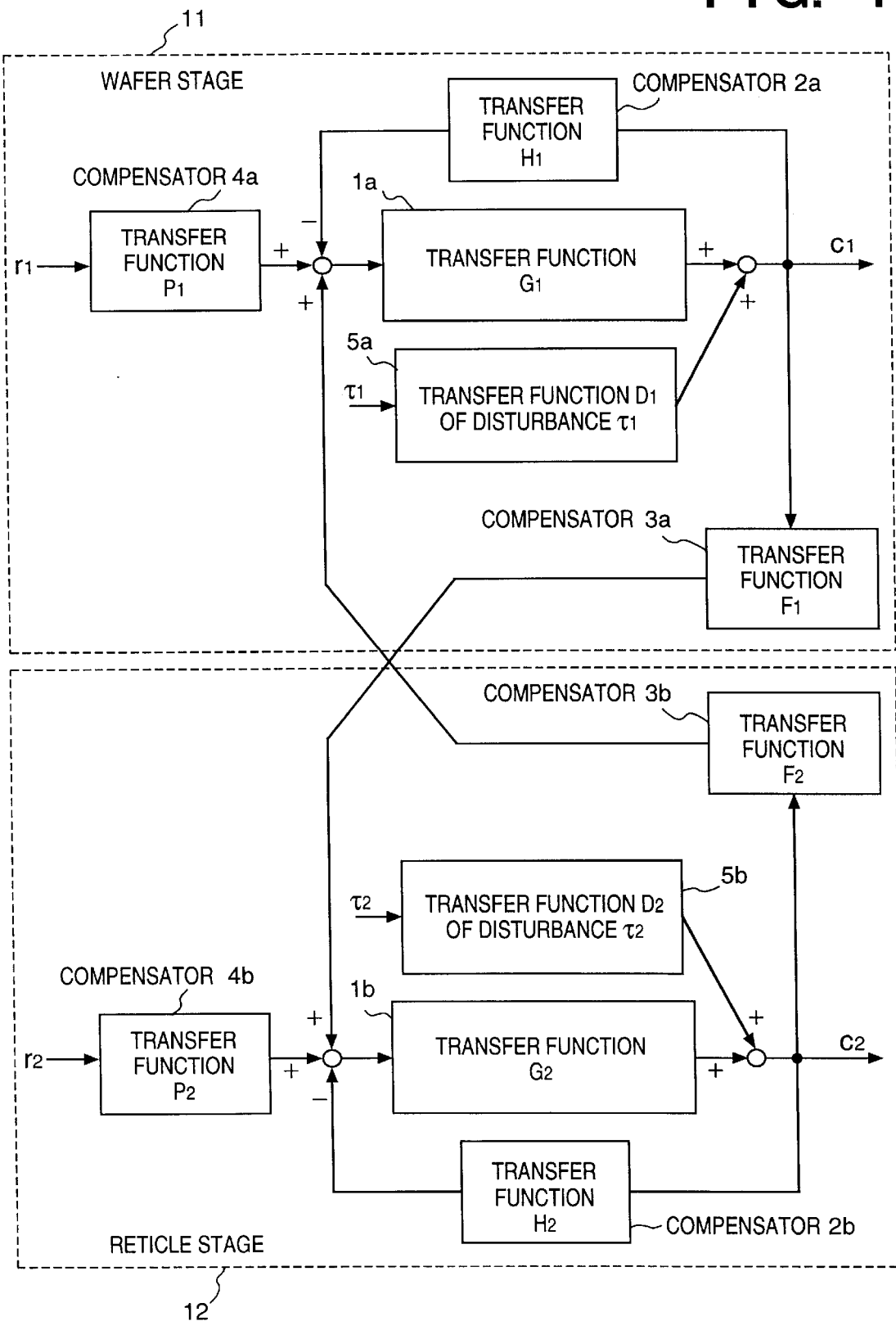
FIG. 1 is a block diagram showing a control system of a synchronous positioning control apparatus according to a first embodiment of the present invention.

FIG. 1 is a block diagram showing a control system of a synchronous positioning control apparatus as a first embodiment of the present invention. In the structure of FIG. 1, a wafer stage indicated by the subscript "1" or "a" is referred to as a manipulation end 1 as an axle, and a reticle stage indicated by the subscript "2" or "b" is referred to as a manipulation end 2 as another axle. Reference characters $r_1$ and $r_2$ indicate a position reference (target position) of both manipulation ends, $c_1$ and $c_2$ indicate controlled variables of both manipulation ends, and $\tau_1$ and $\tau_2$ indicate disturbances added to both manipulation ends. The reference numerals $1a$ and $1b$ denote blocks whose transfer functions $G_1$ and $G_2$ represent the product of dynamic characteristics of the control targets and compensators (referred to as a series compensator) arranged in series. The reference numerals $5a$ and $5b$ denote blocks whose transfer functions $D_1$ and $D_2$ are applied to disturbances $\tau_1$ and $\tau_2$ respectively. The reference numerals $2a$ and $2b$ denote compensators (referred to as a feedback compensator) arranged in the position control feedback loop of both the manipulation ends, and transfer functions thereof are $H_1$ and $H_2$ respectively. The reference numerals $3a$ and $3b$ denote compensators (referred to as a synchronization compensator) arranged in the synchronization compensation loop where the controlled variable of one of the manipulation ends is inputted as the reference to the other manipulation end, and transfer functions thereof are $F_1$ and $F_2$, respectively. The reference numerals $4a$ and $4b$ denote compensators having a role as a reference correction coefficient for coinciding the controlled variables $c_1$ and $c_2$ of both the manipulation ends with the references $r_1$ and $r_2$ in a steady state, and transfer functions thereof are $P_1$ and $P_2$. As is apparent from FIG. 1, since the structures of the control loop of both the manipulation ends are symmetrical, the relation between the manipulation ends are equivalent and there is no distinction between the master axle and the slave axle.

Paying close attention to the manipulation end 1, the position control system consists of a transfer function $G_1$ of the combined system $1a$ of a series compensator and a control target, and a transfer function $H_1$ of the feedback compensator $2a$. The reference $r_1$ is inputted to the position control system after applying a reference correction coefficient $P_1$ of the correction compensator $4a$. The controlled variable $c_1$, an output from the position control system, is applied to the transfer function $F_1$ of the synchronization compensator $3a$, and added to a reference of the position control system in the manipulation end 2 as a feedback. Similarly, a controlled variable $c_2$ of the manipulation end 2 is added to a reference of the position control system in the manipulation end 1 as a feedback after the transfer function $F_2$ of the feedback compensator $3b$ is applied. In other words, a target value inputted to the position control system of the manipulation end 1 is represented as $P_1 r_1 + F_2 c_2$. The feedback where $F_1$ and $F_2$ are arranged is of a positive feedback type, not a negative feedback type. This is because the synchronization compensation feedback has a characteristic that a controlled variable of one of the manipulation ends which is to be fed back becomes a reference for the other manipulation end. When the controlled variable $c_2$ of the manipulation end 2 is altered by disturbance $\tau_2$, $c_2$ is inputted into the manipulation end 1 as a reference; and controlled variable $c_1$ of the manipulation end 1 is altered in accordance with the change of the controlled variable $c_2$; accordingly, synchronization between both manipulation ends is maintained. When disturbance $\tau_1$ is added to the manipulation end 1, the manipulation end 2 complies with a change of the manipulation end 1 to maintain synchronization. Thus, a bilateral synchronization control system with no hierarchical order between a master and a slave axle is constructed as set forth above.

Designs for each of the compensators utilized in the first embodiment of the present invention will be now described. $H_1$ and $H_2$ arranged in the position control feedback loop are a normal proportional action type. It can be defined as a unity feedback. $F_1$ and $F_2$ do not include integral action. Therefore, they should be a proportional action type or proportional+differential action type. Where $F_1$ and $F_2$ are of the proportional action type, a controlled variable of one of the manipulation ends is multiplied with a constant and applied to the reference of the other manipulation end as a feedback. Where $F_1$ and $F_2$ are of the proportional+differential action type, this is equivalent to executing a phase-lead compensation; therefore, quick response of a manipulation end which receives a synchronization compensation feedback can be attained.

Suppose that a synchronization control is performed to maintain a controlled variable of manipulation end 2 $K_r$ times as the controlled variable of the manipulation end 1. Herein, $K_r$ is a positive number. As will be shown in equation (2), the reference $r_2$ of the manipulation end 2 can be expressed as a function of the reference $r_1$ of the manipulation end 1.

$$r_2 = K_r r_1 \tag{2}$$

In the following expansion, $r_2$ is deleted, and consequently, $r_1$ represents a reference to be inputted to the position control system of both manipulation ends. Controlled variable $c_1$ and $c_2$ of both manipulation ends in response to a reference $r_1$ and a disturbances $\tau_1$ and $\tau_2$ are expressed as equations (3) and (4).

$$\{1 + G_1 H_1 + G_2 H_2 + G_1 G_2 (H_1 H_2 - F_1 F_2)\} c_1 = \{(1 + G_2 H_2) G_1 P_1 + \tag{3}$$
$$G_1 G_2 F_2 P_2 K_r\} r_1 + (1 + G_2 H_2) D_1 \tau_1 + G_1 F_2 D_2 \tau_2$$

$$\{1 + G_1 H_1 + G_2 H_2 + G_1 G_2 (H_1 H_2 - F_1 F_2)\} c_2 = \{(1 + G_1 H_1) G_2 P_2 K_r + \tag{4}$$
$$G_1 G_2 F_1 P_1\} r_1 + G_2 F_1 D_1 \tau_1 + (1 + G_1 H_1) D_2 \tau_2$$

Note that $P_1$ and $P_2$ in the equations (3) and (4) are reference correction coefficients established for the purpose of coinciding the controlled variables $c_1$ and $c_2$ with the references $r_1$ and $r_2$ respectively in a steady state. $P_1$ and $P_2$ are defined according to the following equation. Transfer functions $c_1/r_1$ and $c_2/r_1$, that transfer a reference $r_1$ to the controlled variables $c_1$ and $c_2$, are expressed in the following equations (5) and (6).

$$\frac{c_1}{r_1} = \frac{(1 + G_2 H_2) G_1 P_1 + G_1 G_2 F_2 P_2 K_r}{1 + G_1 H_1 + G_2 H_2 + G_1 G_2 (H_1 H_2 - F_1 F_2)} \tag{5}$$

$$\frac{c_2}{r_1} = \frac{(1 + G_1 H_1) G_2 P_2 K_r + G_1 G_2 F_1 P_1}{1 + G_1 H_1 + G_2 H_2 + G_1 G_2 (H_1 H_2 - F_1 F_2)} \tag{6}$$

When the reference $r_1$ changes by a unit step, the controlled variables $c_1$ and $c_2$ after a lapse of enough time, that is, in a steady state, are obtained by taking a limit value of the Laplace operator $s \to 0$ in equations (5) and (6). For the purpose of simplicity, suppose that transfer functions $H_1$, $H_2$, $F_1$, $F_2$ are proportional types. When the numerators and the denominators of the equations (5) and (6) are divided by $G_1$ and $G_2$ respectively, and a limit value at $s \to 0$ is taken, equations (7) and (8) are derived.

$$\lim_{s \to 0} \frac{c_1}{r_1} = \frac{H_2 P_1 + F_2 P_2 K_r}{H_1 H_2 - F_1 F_2} \tag{7}$$

$$\lim_{s \to 0} \frac{c_2}{r_1} = \frac{F_1 P_1 + H_1 P_2 K_r}{H_1 H_2 - F_1 F_2} \tag{8}$$

As can be seen from the equations (7) and (8), the condition shown in the following equation (9) must be satisfied when transfer functions $H_1$, $H_2$, $F_1$, $F_2$ are proportional types.

$$H_1 H_2 - F_1 F_2 \neq 0 \tag{9}$$

Further, in order to derive the equations (7) and (8), the characteristics shown in equations (10) and (11) are utilized. The equations (10) and (11) hold true in an ordinary servo system.

$$\lim_{s \to 0} G_1 = \infty \tag{10}$$

$$\lim_{s \to 0} G_2 = \infty \tag{11}$$

Since $P_1$ and $P_2$ are defined such that controlled variables $c_1$ and $c_2$ respectively coincide with the references $r_1$ and $r_2$ in a steady state, simultaneous equations can be obtained, being that the left side of the equation (7) equals 1 and the left side of the equation (8) equals $K_r$, considering the equation (2). By solving the simultaneous equations, $P_1$ and $P_2$ are defined as shown in the following equations (12) and (13).

$$P_1 = H_1 - F_2 K_r \tag{12}$$

$$P_2 = H_2 K_r - F_1 \tag{13}$$

The transfer functions $H_1$ and $H_2$ must be positive in order for a closed loop of the position control to be stable. The signs of $F_1$ and $F_2$ are also positive, considering the fact that $F_1$ and $F_2$ feeds back a controlled variable of one of the manipulation ends to the other manipulation end as a position target, and also considering that the synchronization compensation loop is a positive feedback in FIG. 1. Further, if $P_1$ and $P_2$ are negative, the sign of a reference would be inputted to the position control system with a reversed sign; therefore, $P_1$ and $P_2$ are also positive. Considering the above factors, the conditions described in equations (14) and (15) must be satisfied among the transfer functions $H_1, H_2, F_1$ and $F_2$.

$$H_1 > F_2 \cdot K_r \geq 0 \tag{14}$$

$$H_2 > F_1 / K_r \geq 0 \tag{15}$$

When the equations (14) and (15) are satisfied, the condition described in foregoing equation (9) is also satisfied.

Next it is determined in a case wherein transfer functions $H_1, H_2, F_1$ and $F_2$ are functions of a Laplace operator s. As exemplified in a proportional+differential action, if the transfer functions $H_1(s), H_2(s), F_1(s)$ and $F_2(s)$ have a finite limited value $H_1(0), H_2(0), F_1(0)$ and $F_2(0)$ at $s \to 0$, a limited value of transfer functions $c_1/r_1$ and $c_2/r_1$ which generate controlled variables $c_1$ and $c_2$ from $r_1$ are finite at $s \to 0$. This is expressed in the following equations (16) and (17), as corresponding to the equations (7) and (8).

$$\lim_{s \to 0} \frac{c_1}{r_1} = \frac{H_2(0)P_1 + F_2(0)P_2 K_r}{H_1(0)H_2(0) - F_1(0)F_2(0)} \tag{16}$$

$$\lim_{s \to 0} \frac{c_2}{r_1} = \frac{F_1(0)P_1 + H_1(0)P_2 K_r}{H_1(0)H_2(0) - F_1(0)F_2(0)} \tag{17}$$

Accordingly, $P_1$ and $P_2$ are determined to be the following equations (18) and (19).

$$P_1 = H_1(0) - F_2(0) K_r \tag{18}$$

$$P_2 = H_2(0) K_r - F_1(0) \tag{19}$$

Likewise, the conditions set forth in equations (20) and (21) must be satisfied.

$$H_1(0) > F_2(0) K_r \geq 0 \tag{20}$$

$$H_2(0) > F_1(0)/K_r \geq 0 \tag{21}$$

If a synchronization error e is defined as the aforementioned equation (1), e can be expressed as shown in the equation (22) by substituting the equations (3) and (4) into the equation (1).

$$\{1 + G_1 H_1 + G_2 H_2 + G_1 G_2 (H_1 H_2 - F_1 F_2)\} e = \tag{22}$$

$$\{(1 + G_2 H_2) G_1 P_1 - (1 + G_1 H_1) G_2 P_2 K_r + G_1 G_2 (F_2 P_2 K_r - F_1 P_1)\} r_1 +$$

$$\{1 + G_2 (H_2 - F_1)\} D_1 \tau_1 - \{1 + G_1 (H_1 - F_2)\} D_2 \tau_2$$

The first term of the right side in equation (22) represents an error response corresponding to a reference $r_1$, the second term represents an error response corresponding to a disturbance $\tau_1$ added to the manipulation end 1, and the third term represents an error response corresponding to a disturbance $\tau_2$ added to the manipulation end 2.

<Second Embodiment>

Figure 2:
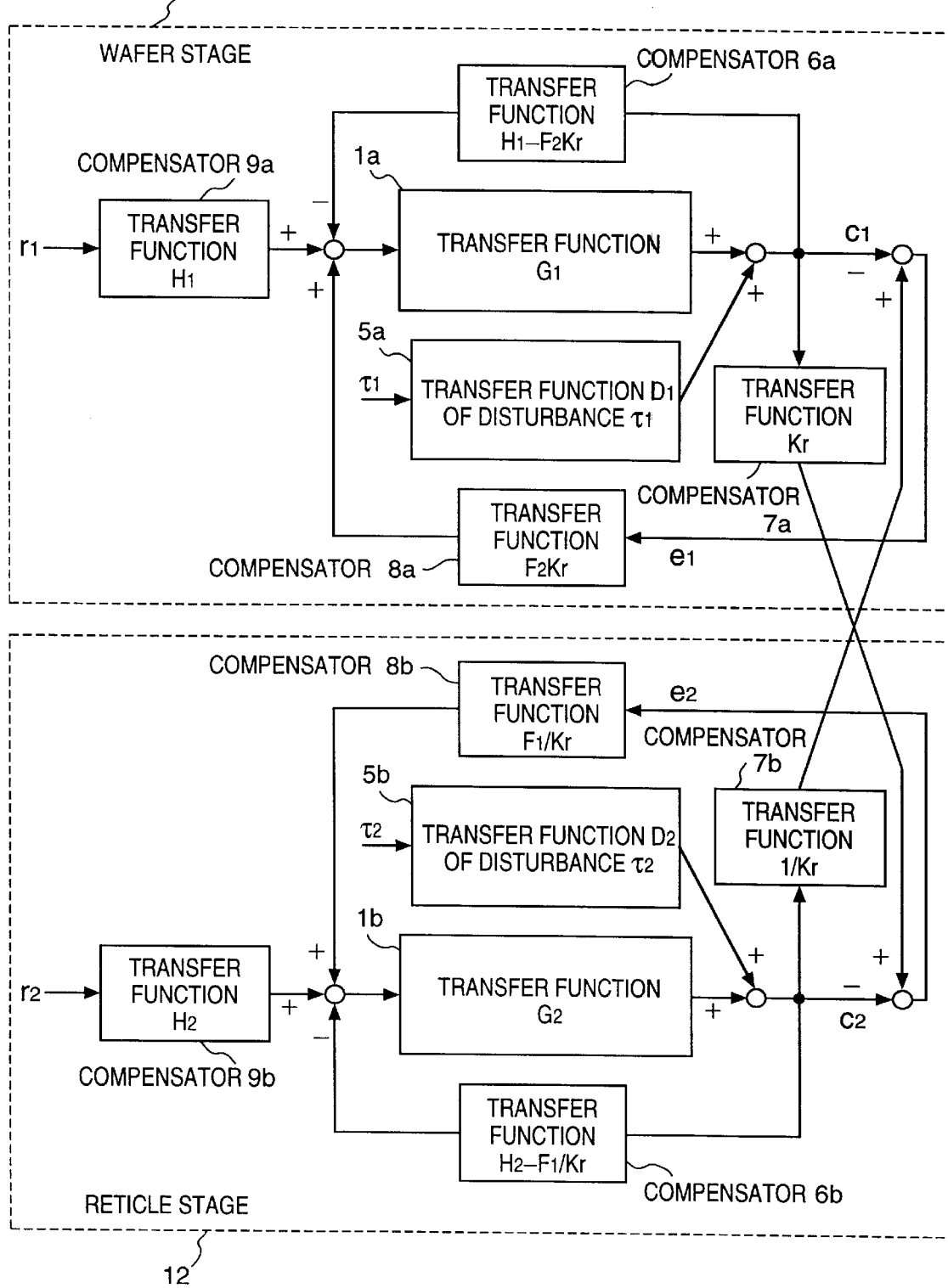
FIG. 2 is a block diagram showing a control system of a synchronous positioning control apparatus according to a second embodiment of the present invention.
Figure 4:
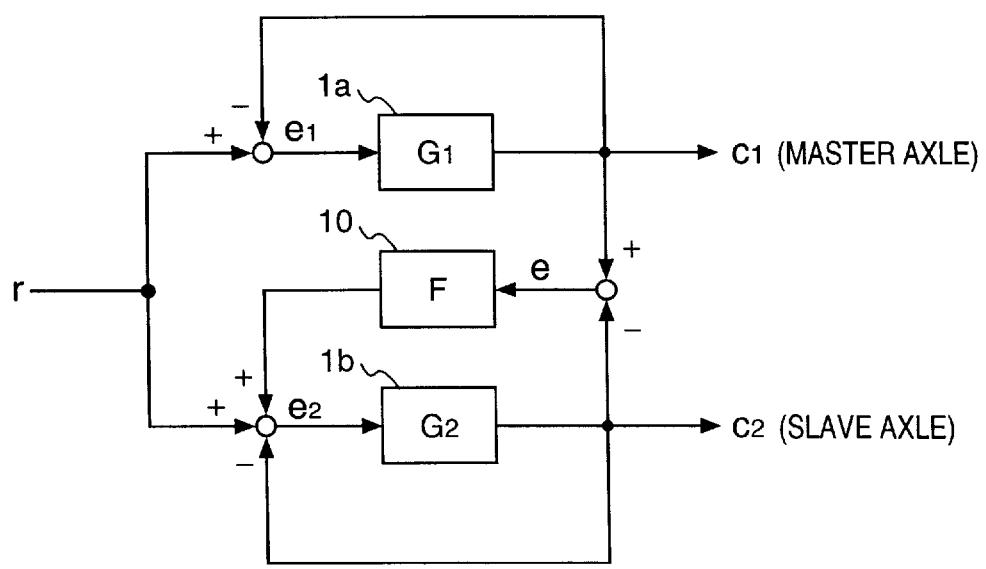
FIG. 4 is a block diagram describing a control system of a conventional master-slave synchronization control method.
Figure 5:
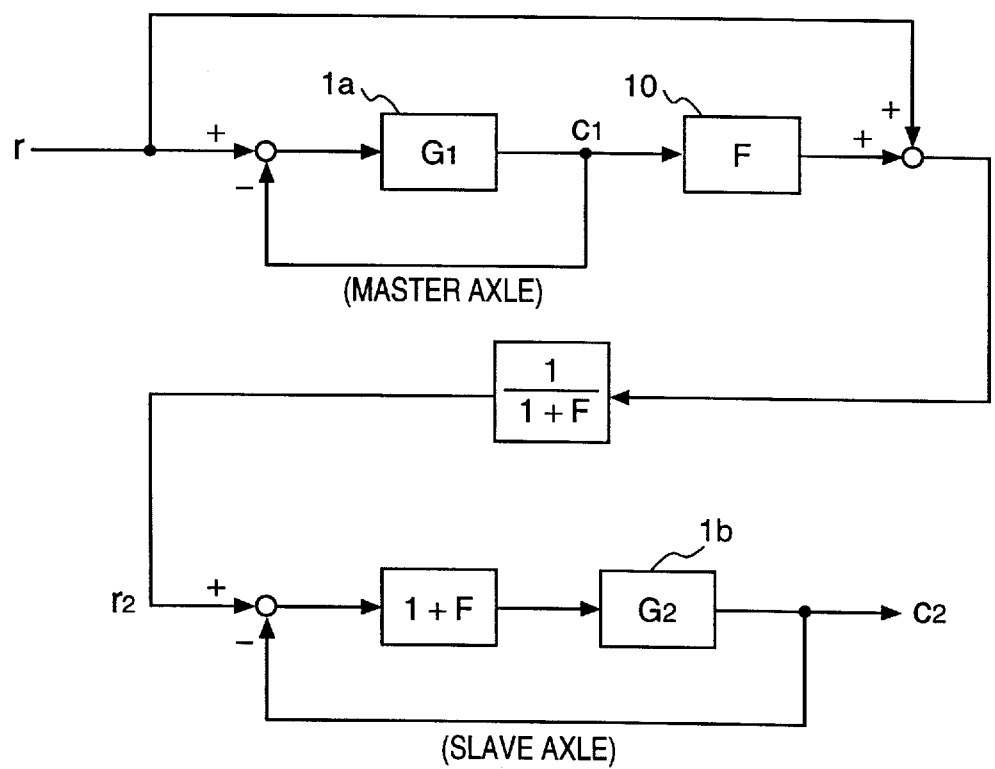
FIG. 5 is a block diagram of a control system utilizing a master-slave synchronization control method obtained by an equivalent transformation of the block diagram shown in FIG. 4.

When the block diagram shown in FIG. 1 is equivalently transformed, the block diagram describing the control system of the synchronous positioning control apparatus shown in FIG. 2 can be obtained. In the block diagram shown in FIG. 2, $K_r$ is specified in the transfer function blocks 7a and 7b, taking into account that the reference $r_2$ of the manipulation end 2 is $K_r$ times the reference $r_1$ of the manipulation end 1. Conversely, if FIG. 2 is equivalently transformed to derive FIG. 1, $K_r$ is deleted in the process of transformation; therefore, FIG. 1 and FIG. 2 are equivalent. FIG. 2 shows a second embodiment of the present invention. With reference to the manipulation end 1 in the block diagram of FIG. 2, a synchronization error $e_1$ is obtained by multiplying a controlled variable $c_2$ of the manipulation end 2 by $1/K_r$, then subtracting a controlled variable $c_1$ of the manipulation end 1, and further applying $F_2 K_r$ which is a transfer function of compensator 8a, and fed back to the position control system of the manipulation end 1. Similarly, with reference to the manipulation end 2, a synchronization error $e_2$ is obtained by multiplying $c_1$ by $K_r$, subtracting $c_2$, then applying $F_1/K_r$ which is a transfer function of compensator 8b, to be fed back to the position control system of the manipulation end 2. The first embodiment of the present invention illustrated in FIG. 1 is based on a design idea that a master-slave method, where an output of one of the manipulation ends is inputted to the other manipulation end as shown in FIG. 5, is developed into a bilateral method, while the second embodiment of the present invention illustrated in FIG. 2 is based on an idea that a loop structure of the conventional master-slave method, where a synchronization error is fed back to a slave side as a reference as shown in FIG. 4, is developed into a bilateral method. As described above, it is possible to derive other bilateral synchronization control methods by an equivalent transformation of the first embodiment of the present invention as shown in FIG. 1. In this regard, since the purposes for having a synchronization compensation loop vary depending on methods, designs of the synchronization compensators 7a and 7b vary according to the methods. In other words, various synchronization control methods with different design ideas can result in the first embodiment of the present invention which has the simplest loop structure as a bilateral method, by an equivalent transformation.

As shown in FIG. 2, when a synchronization compensation is performed by a feedback loop of a synchronization error, the synchronization errors $e_1$ and $e_2$ are expected to be zero at a steady state; therefore, it is possible for $F_1$ and $F_2$ to have an integral action or a double integral action. In this connection, transfer functions $H_1$ and $H_2$ must also have an integral action to cancel the effect of an integrator $H_1$ and $F_2 K_r$ or $H_2$ and $F_1/K_r$ in $H_1-F_2 K_1$ and $H_2-F_1/K_r$, consequently withholding the effect of an integral action of the transfer functions $H_1-F_2 K_r$ and $H_2-F_1/K_r$. In other words, $H_1'$ and $H_2'$ may have an appropriate proportional action such as $H'_1 = H_1 - F_2 K_r$ or $H'_2 = H_2 - F_1/K_r$ regardless of whether or not $F_1$ and $F_2$ have an integral action.

When the transfer functions $H_1(s)$, $H_2(s)$, $F_1(s)$ and $F_2(s)$ include an integral action and diverge infinitely at $s \to 0$, it is difficult to analytically determine reference correction coefficients $P_1$ and $P_2$ as does the first embodiment. Herein, how to determine $P_1$, $P_2$ will be described in a case where $H_1(s)$, $H_2(s)$, $F_1(s)$ and $F_2(s)$ include an integral action in the second embodiment illustrated in FIG. 2. In a loop structured control system as shown in FIG. 2, with reference to the manipulation end 1, $P_1$ is determined such that a transfer function $G_1$ and an output $c_1$ of a position control system consisting of $H_1-F_2 K_r$ coincide with a reference $r_1$. The same theory applies to the manipulation end 2. As described above, it is designed such that $H_1-F_2 K_r$ and $H_2-F_1/K_r$ do not have an integral action even when $H_1(s)$, $H_2(s)$, $F_1(s)$ and $F_2(s)$ each has an integral action. Accordingly, $H_1-F_2 K_r$ and $H_2-F_1/K_r$ have a finite limited value at $s \to 0$. $P_1$ and $P_2$ are determined by the following equations (23) and (24).

$$P_1 = (H_1 - F_2 K_r)(0) \qquad (23)$$

$$P_2 = (H_2 K_r - F_1)(0) \qquad (24)$$

Conditions are expressed as equations (25) and (26).

$$(H_1 - F_2 K_r)(0) \geq 0 \qquad (25)$$

$$(H_2 - F_1/K_r)(0) \geq 0 \qquad (26)$$

Equation (22) is a response expression of the synchronization error e derived from the first embodiment of the present invention. Likewise, a response expression of a synchronization error e identical to the equation (22) can be obtained from the second embodiment of the present invention.

Note that the above-described embodiment describes a case where two stages are moved in opposite directions for maintaining synchronization. The present invention also can be applied to a machining system where a plurality of stages are controlled to move in the same direction for maintaining synchronization. The present invention is also applicable to a machining system having more than three manipulation ends. In this case, positions of the remaining manipulation ends, or a deviation signal with an appropriate weight added thereto, or a combined signal without any weight added thereto, may be inputted to a feedback system of each manipulation end; or, a signal giving a largest effect on a manipulation end may be inputted; or, it may be inputted sequentially i.e., a signal of the first manipulation end to a feedback system of the second manipulation end, a signal of the second manipulation end to a feedback system of the third manipulation end . . . and a signal of the last manipulation end to the feedback system of the first manipulation end.

According to the present invention, the synchronous positioning control apparatus and method thereof can be provided as described above, which is capable of a bilateral synchronization control for maintaining synchronization despite a disturbance added to stages, wherein each of the stages is equivalent to one another in a synchronization control of a plurality of stages, such as a wafer stage and a reticle stage in a scan-type exposure apparatus.

Further, the stages of the first and second embodiments discussed above are for a wafer and a reticle. In the present invention, however, the stages should be interpreted as being anything which can be servo-controlled, such as end effectors, manipulation axles, or actuators.

The present invention can be applied to a system constituted by a plurality of devices, or to an apparatus comprising a single device. Furthermore, the invention is also applicable where the object of the invention is attained by supplying a program to a system or an apparatus.

The present invention is not limited to the above embodiments and various changes and modifications can be made within the spirit and scope of the present invention. Therefore to apprise the public of the scope of the present invention, the following claims are made.

What is claimed is:

1. A control method for a synchronous positioning control apparatus for servo-controlling positions of a plurality of stages in different feedback loops in order to synchronously position the plurality of stages, said method comprising:
   supplying a feedback loop of each of the stages with position information of at least one of the other stages.

2. A control method for a synchronous positioning control apparatus for servo-controlling positions of a first stage and a second stage in different feedback loops in order to synchronously control the first stage and the second stage, said method comprising:
   supplying a feedback loop of the second stage with position information of the first stage; and
   supplying a feedback loop of the first stage with position information of the second stage,
   wherein each of the stages is synchronously Positioned using the respectively fed-back information.

3. A synchronous positioning control apparatus for servo-controlling positions of a plurality of stages in different feedback loops in order to synchronously control the stages, said apparatus comprising:
   a supply device for supplying a feedback loop of each of the stages with position information of at least one of the other stages.

4. A synchronous positioning control apparatus for servo-controlling positions of a first stage and a second stage in different feedback loops in order to synchronously control the first stage and the second stage, said apparatus comprising:
   synchronization compensation means for applying position information of the first stage to a feedback loop of the second stage and position information of the second stage to a feedback loop of the first stage.

5. A synchronous positioning control apparatus having a first stage and a first position control system which controls a position of the first stage, and a second stage and a second position control system which controls a position of the second stage, for synchronously controlling the first stage and the second stage, said apparatus comprising:
   a first position control system comprising:
      (i) first driving means for driving the first stage in accordance with a predetermined input signal;
      (ii) first feedback means for feeding back a signal as a negative feedback, which corresponds to a position of the first stage, to an input side of said first driving means;

(iii) first reference correction means for supplying a signal, which corresponds to a position target value of the first stage, to an input side of said first driving means;

(iv) first synchronization compensation means for supplying a signal, which corresponds to a position of the second stage, to an input side of said first driving means; and (v) first signal combining means for combining output signals from said first feedback means, said first reference correction means and said first synchronization compensation means, and for supplying the combined signal to said first driving means as the predetermined input signal; and a second position control system comprising:

(i) second driving means for driving the second stage in accordance with a predetermined input signal;

(ii) second feedback means for feeding back a signal as a negative feedback, which corresponds to a position of the second stage, to an input side of said second driving means;

(iii) second reference correction means for supplying a signal, which corresponds to a position target value of the second stage, to an input side of said second driving means;

(iv) second synchronization compensation means for supplying a signal, which corresponds to a position of the first stage, to an input side of said second driving means; and (v) second signal combining means for combining output signals from said second feedback means, said second reference correction means and said second synchronization compensation means, and for supplying the combined signal to said second driving means as the predetermined input signal.

6. A synchronous positioning control apparatus according to claim 5, wherein said first and said second synchronization compensation means each comprise a proportional action compensator which outputs a signal proportional to positions of the second and first stages.

7. A synchronous positioning control apparatus according to claim 5, wherein said first and said second synchronization compensation means each comprise a proportional-differential action compensator which outputs a signal proportional to a change of positions of the second and first stages.

8. A synchronous positioning control apparatus according to claim 5, wherein the first and second stages are a wafer stage and a reticle stage utilized in a scan-type exposure apparatus.

9. A synchronous positioning control apparatus according to claim 6, wherein the first and second stages are a wafer stage and a reticle stage utilized in a scan-type exposure apparatus.

10. A synchronous positioning control apparatus according to claim 7, wherein the first and second stages are a wafer stage and a reticle stage utilized in a scan-type exposure apparatus.

* * * * *

UNITED STATES PATENT AND TRADEMARK OFFICE
CERTIFICATE OF CORRECTION

PATENT NO. : 5,812,396
DATED : September 22, 1998
INVENTOR(S) : HIROAKI KATO

It is certified that error appears in the above-identified patent and that said Letters Patent is hereby corrected as shown below:

COLUMN 2,
Line 41, "is identical" should read --are identical--.

COLUMN 4,
Line 16, "conceptional" should read --conceptual--.

COLUMN 5,
Line 10, "$H_2$" should read --$H_2,$--.

COLUMN 6,
Line 22, "and a" should read --and--;
Line 26, "$F_1F_2)c_1$" should read --$F_1F_2)\}c_1$--; and
Line 29, "$F_1F_2)c_2$" should read --$F_1F_2)\}c_2$--.

COLUMN 7,
Line 27, "feeds" should read --feed--.

COLUMN 10,
Line 37, "Positioned" should read --positioned--.

Signed and Sealed this

First Day of June, 1999

Attest:

Q. TODD DICKINSON

*Attesting Officer*　　　Acting Commissioner of Patents and Trademarks